(12) United States Patent  
Kim (10) Patent No.: US 6,442,716 B1
(45) Date of Patent: Aug. 27, 2002

(54) DATA OUTPUT BUFFER (75) Inventor: Jae-Woon Kim, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/482,678

(22) Filed: Jan. 14, 2000

(30) Foreign Application Priority Data

Jan. 18, 1999 (KR) .............................................. 99-1220

(51) Int. Cl.[7] ................................................ G11C 29/00
(52) U.S. Cl. ...................................... 714/718; 365/201
(58) Field of Search ................................ 714/718, 721; 365/201

(56) References Cited

U.S. PATENT DOCUMENTS

| | | | | |
|---|---|---|---|---|
| 5,467,356 A | * | 11/1995 | Choi | 714/718 |
| 5,621,335 A | * | 4/1997 | Andresen | 326/30 |
| 5,764,573 A | * | 6/1998 | Iketani et al. | 365/189.03 |
| 5,808,478 A | * | 9/1998 | Andresen | 326/30 |
| 5,875,137 A | * | 2/1999 | Suzuki | 365/193 |
| 5,919,269 A | * | 7/1999 | Ong | 324/765 |
| 5,995,010 A | * | 11/1999 | Blake et al. | 324/73.1 |
| 6,157,223 A | * | 12/2000 | Blake | 327/108 |

* cited by examiner

*Primary Examiner*—Albert Decady
*Assistant Examiner*—Cynthis Harris
(74) *Attorney, Agent, or Firm*—Fleshner & Kim, LLP (57) ABSTRACT

A data output buffer is disclosed that includes an input section receiving a data signal and an output enable signal to output a pull-up signal and a pull-down signal, a drive control section and a plurality of output driving sections. The drive control section activates less than all of the plurality of drive control signals in response to the data signal in a second mode and activates all the drive control signals in normal operations or a first mode. The plurality of output driving sections each receive the pull-up signal, the pull-down signal and one of the drive control signals to perform a pull-up operation or pull-down operation in accordance with the logic value of the data signal when activated.

19 Claims, 7 Drawing Sheets

FIG. 1

PRIOR ART

FIG. 2

PRIOR ART

DATA OUTPUT BUFFER

BACKGROUND OF THE INVENTION

1. Field of the Invention

The present invention relates to a buffer and, more particularly, to a data output buffer of a semiconductor integrated circuit.

2. Background of the Related Art

Breakdowns and errors in operation of a semiconductor integrated circuit result from defects. Such defects of the semiconductor integrated circuit are caused by breakdowns during the use of the circuit as well as errors in the fabrication process.

The probability of defects in the semiconductor integrated circuit is called "failure rate". The failure rate may be divided into three categories, infant mortality, useful life time and wear-out time.

The failure rate in the infant mortality results from breakdowns that are not detected in the test process, but exist in the integrated circuit, or defects that cause breakdowns. Most of the breakdowns develop from the initial defects in the useful life time of the integrated circuit. Usually, a test to detect the initial failure is carried out in the fabrication process of the integrated circuit. Such a test is called a "burn-in test".

The burn-in test refers to a method of checking the presence of breakdowns by operating the integrated circuit under the conditions of high supply voltage and high temperature for a long time and then performing an examination for the performance of the integrated circuit. The conditions in the burn-in test mode are varied depending on the type of the product. If the regulated supply voltage is 5 volts, the burn-in test of a semiconductor memory, for example, imposes stress upon the semiconductor memory by performing write and read operations at a high voltage of 8 volts and at a temperature of about 100° C. for 24 hours or so.

Usually, the burn-in test is carried out for a plurality of chips at once to shorten the time for test of the semiconductor integrated circuit. The burn-in test is also performed for a plurality of chips in a simultaneous manner. To test plural chips at one time, the chips are connected in common to a data output pad and the burn-in test is performed. A semiconductor integrated circuit including a semiconductor memory is usually designed to output internally generated signals outwardly via a data output buffer. An output of the data output buffer is transferred to the data output pad.

Figure 1:
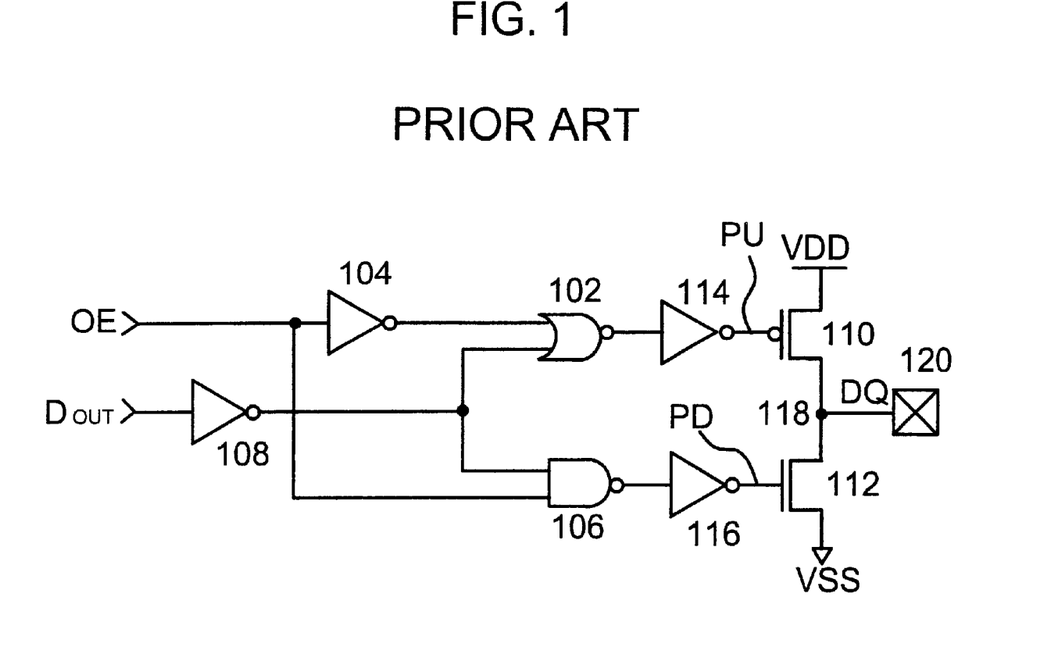
FIG. 1 is a circuit diagram showing a related art data output buffer.

FIG. 1 is a circuit diagram showing a related art data output buffer. As shown in FIG. 1, two inverter circuits 104 and 108 invert an output enable signal OE and a data signal $D_{OUT}$, respectively, which are then input to a NOR gate 102. The output enable signal OE and the inverted data signal $D_{OUT}$ are input to a NAND gate 106. An output driving section is made up of a PMOS transistor 110, which operates as a pull-up device, and an NMOS transistor 112, which operates a pull-down device. The PMOS transistor 110 and the NMOS transistor 112 are connected in series between supply voltage $V_{DD}$ and ground line $V_{SS}$.

The output of the NOR gate 102 is inverted by an inverter circuit 114 and applied to the gate of the PMOS transistor 110. The output of the NAND gate 106 is inverted by an inverter circuit 116 and applied to the gate of the NMOS transistor 112. An output line 118, which is connected in common to the drains of the PMOS transistor 110 and the NMOS transistor 112, is connected to a data output pad 120.

If the output enable signal OE is set to "0" (i.e., low logic level), then the output driving section is in a floating state regardless of the logic value of the data signal $D_{OUT}$. With the output signal OE at the low logic level, the output of the NOR gate 102 is 0, and the output of the NAND gate 106 is 1 (at a high logic level). The output of the NOR gate 102, which is 0, is inverted to 1 (HIGH) turning the PMOS transistor 110 off. The output of the NAND gate 106, which is 1, is inverted to 0 (LOW) turning the NMOS transistor 112 off.

If the output enable signal OE is set to 1, then the output driving section is pulled up or pulled down depending on the logic value of the data signal $D_{OUT}$. If the output enable signal OE is 1, the outputs of the NOR gate 102 and the NAND gate 106 have the same logic value as the data signal $D_{OUT}$. Accordingly, pull-up signal PU and pull-down signal PD output by the two inverter circuits 114 and 116, respectively, in this case have the logic value opposite to the data signal $D_{OUT}$.

If the output enable signal OE is set to 1 with the data signal $D_{OUT}$ being 1, the pull-up signal PU is 0 and the PMOS transistor 110 is on. At the same time, the pull-down signal PD is also 0 and the NMOS transistor 112 is off. Accordingly, the output line 118 is pulled up to the supply voltage to transfer output data signal DQ, which is 1, to the data output pad 120.

If the output enable signal OE is set to 1 with the data signal $D_{OUT}$ being 0, the pull-up signal PU is 1 and the PMOS transistor 110 is off. At this time, the pull-down signal PD is also 1 and the NMOS transistor 112 is on. Thus, the output line 118 is pulled down to the ground level $V_{SS}$ to transfer the output data signal DQ, which is set to 0, to the data output pad 120.

Figure 2:
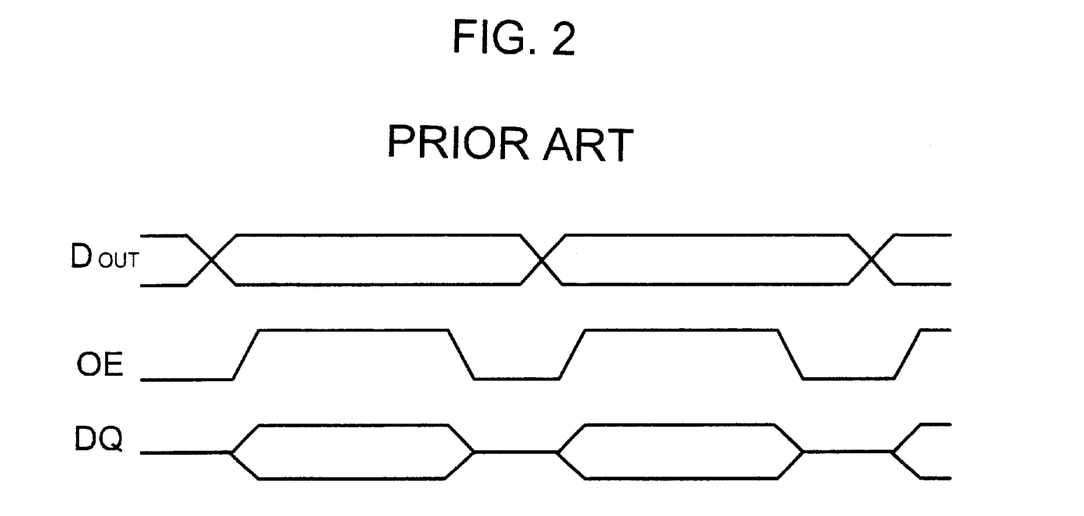
FIG. 2 is a timing diagram illustrating operational characteristics of the related art data output buffer of FIG. 1.

Such an operational characteristic of the related art data output buffer is illustrated in the timing diagram shown in FIG. 2. As shown in FIG. 2, the output of the output data signal DQ conducts only while the output enable signal OE is 1.

As described above, the related art data output buffer has various disadvantages. In the related art data output buffer, shown in FIG. 1, the PMOS transistor 110 and the NMOS transistor 112, which constitute the output driving section, have a high current driving capacity relative to the MOS transistors of the other circuits. The high current driving capability is required because the data output buffer is required not only to be at a logic level in accord to that of the external device, but also to drive a load of very high capacity at high speed. Thus, in the burn-in test mode in which a supply voltage much higher than the regulated voltage is applied, an excessive current flows across the output driving section of a data output buffer that has the high current driving capacity. Further, in case of a simultaneous test for multiple chips, it is difficult to perform a stable burn-in test because of such an excessive current flowing in the burn-in test board.

SUMMARY OF THE INVENTION

An object of the present invention is to provide a data output buffer that substantially obviates one or more of the problems caused by disadvantages and limitations of the related art.

Another object of the present invention is to provide a data output buffer having an output driving section with multiple stages.

Another object of the present invention is to provide a data output buffer that has a reduced current flow in a burn-in mode.

Another object of the present invention is to divide the output driving section of a data output buffer into multiple stages and drive it in sequence.

Another object of the present invention is to provide a data output buffer with a first driving capability in a first mode and a reduced second driving capability in a second mode by sequentially using one of a plurality of stages in the second mode.

Another object of the present invention is to provide an output buffer for a plurality of chips that use a reduced current when concurrently driven in a burn-in-test.

To achieve at least the above objects of the present invention in a whole or in parts, a data output buffer includes an input circuit that receives a data signal and an output enable signal, wherein when the output enable signal is a prescribed value, first and second signals having logic values based on the data signal are output by the input circuit, a drive control circuit that receives a burn-in enable signal and a clock signal and activates a subset of a plurality of drive control signals, and a plurality of output driving circuits, each receiving the first and second signals and a corresponding one of the drive control signals, wherein the subset of drive control signals activate a data output operation in the corresponding ones of the plurality of drive control circuits depending on the logic value of the data signal.

To further achieve at least the above objects of the present invention in a whole or in parts, a data output buffer includes input means for receiving a data signal and an output enable signal, wherein when the output enable signal is a prescribed value, a pull-up signal having the same logic value as the data signal and a pull-down signal having an inverted logic value of the data signal are output by the input section, drive control means for receiving that receives a first signal and a second signal and/or alternately activating first and second drive control signals, first output driving means for receiving the pull-up signal and the pull-down signal and is enabled by the first drive control signal for performing a pull-up or pull-down operation depending on the logic value of the data signal, and second output driving means for receiving the pull-up signal and the pull-down signal and is enabled by the second drive control signal for performing the pull-up or pull-down operations depending on the logic value of the data signal.

To further achieve at least the above objects of the present invention in a whole or in parts, a data output buffer includes an input section that receives a data signal and a control signal, wherein when the control signal is a prescribed value, first and second signals having logic values based on the data signal are output by the input section, and -an output section including a plurality of output driving sections coupled to an output line, each receiving the first and second signals and a corresponding one of a plurality of second control signals, wherein the data output buffer operates in a normal mode and a burn-in mode, wherein the burn-in mode of the data output buffer selectively activates a subset of the plurality of drive control sections according to the second control signals so that a current driving capacity of the output line in the burn-in mode is reduced.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed Out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 3:
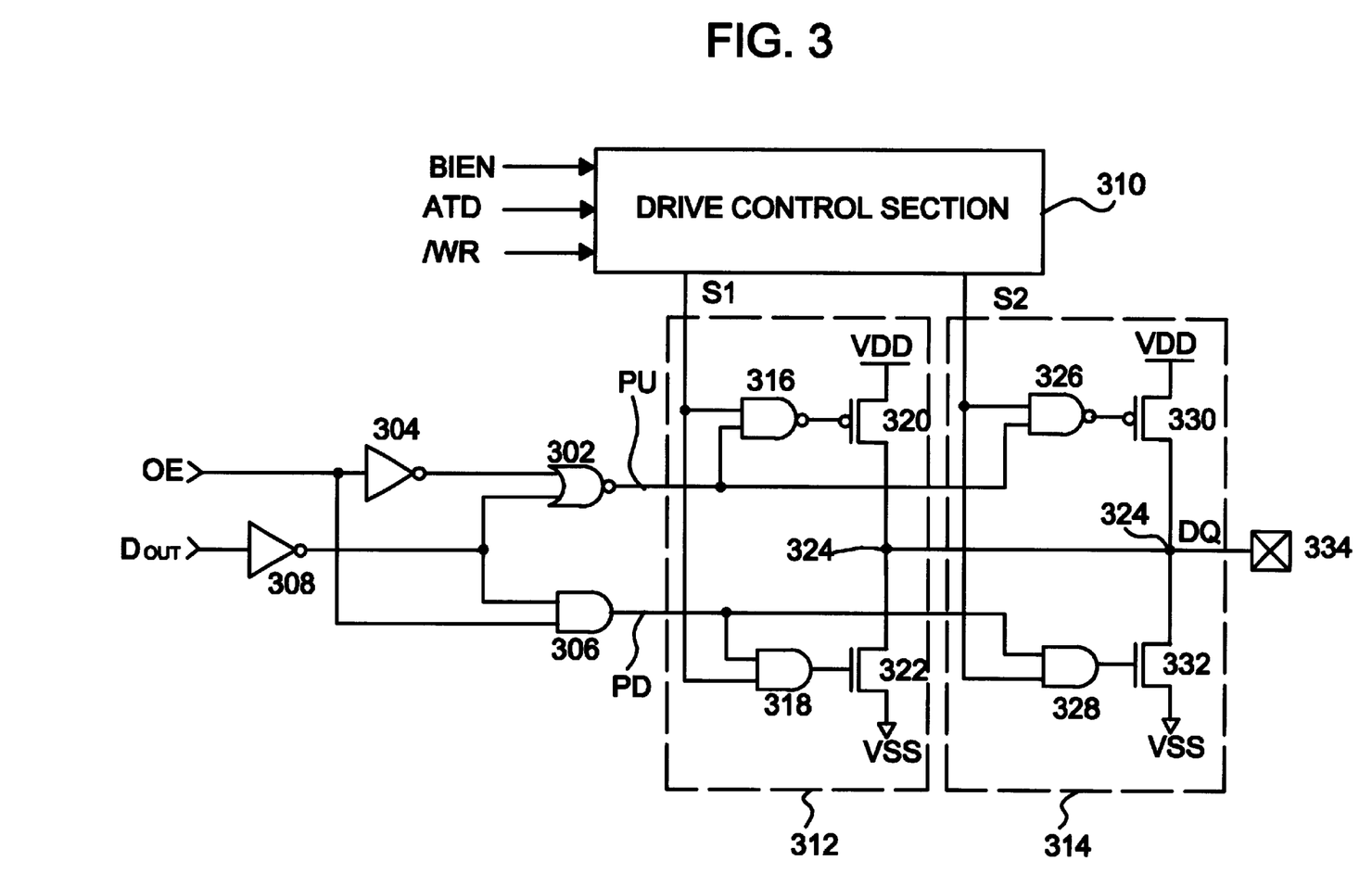
FIG. 3 is a circuit diagram showing a preferred embodiment of a data output buffer according to the present invention.

FIG. 3 is a circuit diagram that shows a first preferred embodiment of a data output buffer according to the present invention. As shown in FIG. 3, an input section includes two inverter circuits 304 and 308, a NOR gate 302, and an AND gate 306. The two inverter circuits 304 and 308 invert an output enable signal OE and a data signal $D_{OUT}$, respectively, which are both then input to the NOR gate 302. The output enable signal OE and the inverted data signal $D_{OUT}$ are input to the AND gate 306. The outputs of the NOR gate 302 and the AND gate 306 are input to first and second output driving sections 312 and 314 as pull-up signal PU and pull-down signal PD, respectively.

Burn-in enable signal BIEN, address shift detection signal ATD and an inverted write signal (i.e., write bar signal) /WR are input to a drive control section 310. The drive control section 310 uses these input signals to generate first and second drive control signals S1 and S2. The first drive control signal S1 is input to the first output driving section 312, and the second drive control signal S2 is input to the second output driving section 314.

In the first output driving section 320, PMOS transistor 320, which is a pull-up device, and NMOS transistor 322, which is a pull-down device, are coupled in series between supply voltage $V_{DD}$ and ground line $V_{SS}$. The pull-up signal PU and the first drive control signal SI are fed into a NAND gate 316. The output of the NAND gate 316 is input to a gate of the PMOS transistor 320. The pull-down signal PD and the first drive control signal S1 are fed into an AND gate 318. The output of the AND gate 318 is input to a gate of the NMOS transistor 322. An output line 324 coupled to drains of the PMOS transistor 320 and the NMOS transistor 322, respectively, is also coupled to a data output pad 334.

The current driving capacities of the first and second output driving sections 312 and 314 are preferably half the total current driving capacity of the data output buffer shown in FIG. 3. However, the present invention is not intended to be so limited. Accordingly, in a normal operation mode, the first and second output driving sections 312 and 314 are both activated to provide a current driving capacity required for normal operations or normal mode. In the burn-in test mode, however, either one of the first and second output driving sections 312 and 314 is preferably activated such that the current driving capacity of the data output buffer is reduced by approximately ½.

The first drive control signal S1 of the drive control section 310 activates the first output driving section 312. If the first drive control signal S1 is set to 1, the logic value of the pull-up signal PU effects the output of the NAND gate 316, and the logic value of the pull-down signal PD effects the output of the AND gate 318.

If the first drive control signal S1 is set to 0, then the output of the NAND gate 316 is held at a high logic level, and the output of the AND gate 318 is held at a low logic level. Accordingly, the PMOS transistor 320 and the NMOS transistor 322 are both off.

Thus, the first output driving section 312 turns to the floating state.

In the second output driving section 322, PMOS transistor 330, which operates as a pull-up device, and NMOS transistor 332, which operates as a pull-down device, are coupled in series between the supply voltage $V_{DD}$ and the ground line $V_{SS}$. The pull-up signal PU and the second drive control signal S2 are fed into a NAND gate 326. The output of the NAND gate 326 is input to a gate of the PMOS transistor 330. The pull-down signal PD and the second drive control signal S2 are fed into an AND gate 328. The output of the AND gate 328 is input to a gate of the NMOS transistor 332. The output line 334 is coupled to drains of the PMOS transistor 330 and the NMOS transistor 332 and is coupled to the data output pad 334. Thus, the structure of the second output driving section 314 is analogous to that of the first output driving section 312 with an exception that the second drive control signal S2 is input.

The second drive control signal S2 activates the second output driving section 314.

If the second drive control signal S2 is set to 1, the logic value of the pull-up signal PU effects the output of the NAND gate 326, and the logic value of the pull-down signal PD effects the output of the AND gate 328. If the second drive control signal S2 is 0, the second output driving section 314 turns to the floating state.

Assume that the output enable signal OE is set to 0. The output driving sections can be in the floating state irrespective of the logic value of the data signal $D_{OUT}$. With the output enable signal OE being 0, the outputs of the NOR gate 302 and the AND gate 306 are both 0. At this time, the outputs of the first output driving section 312 and the NAND gate 326 are 1, and the output of the AND gate 328 is 0. Consequently, the PMOS transistor 330 and the NMOS transistor 332 are both off. If the output enable signal OE is 0, therefore, the second output driving section 314 also turns to the floating state.

Next assume that the output enable signal OE is set to 1. The output driving sections 312 and 314 may be pulled up or pulled down depending on the logic value of the data signal $D_{OUT}$. If the output enable signal OE is 1, then the output of the NOR gate 302 has the same logic value as that of the data signal $D_{OUT}$ and the output of the AND gate 306 having the inverted logic value of the data signal $D_{OUT}$.

If the output enable signal OE is set to 1 with the data signal $D_{OUT}$ being 1, the pull-up signal PU is 1. At the same time, if the first drive control signal S1 is 1, then the output of the NAND gate 316 is 0. Under the same input conditions, the pull-down signal PD is 0 and the output of the AND gate 318 is 0. As a result, the PMOS transistor 320 appears with the NMOS transistor 322 off and the output line 324 is pulled up to the supply voltage $V_{DD}$ level.

Contrarily, if the output enable signal OE is 1 with the data signal $D_{OUT}$ being 0, then the pull-up signal PU is 0. The output of the NAND gate 316 is held at a high logic level irrespective of the logic value of the first drive control signal S1. At this time, the pull-down signal PD is 1, and then, the output of AND gate 318 is 1. Thus, the PMOS transistor 320 is off with the NMOS transistor 322 on such that the output line 324 is pulled down to the ground $V_{SS}$ level.

Figure 4:
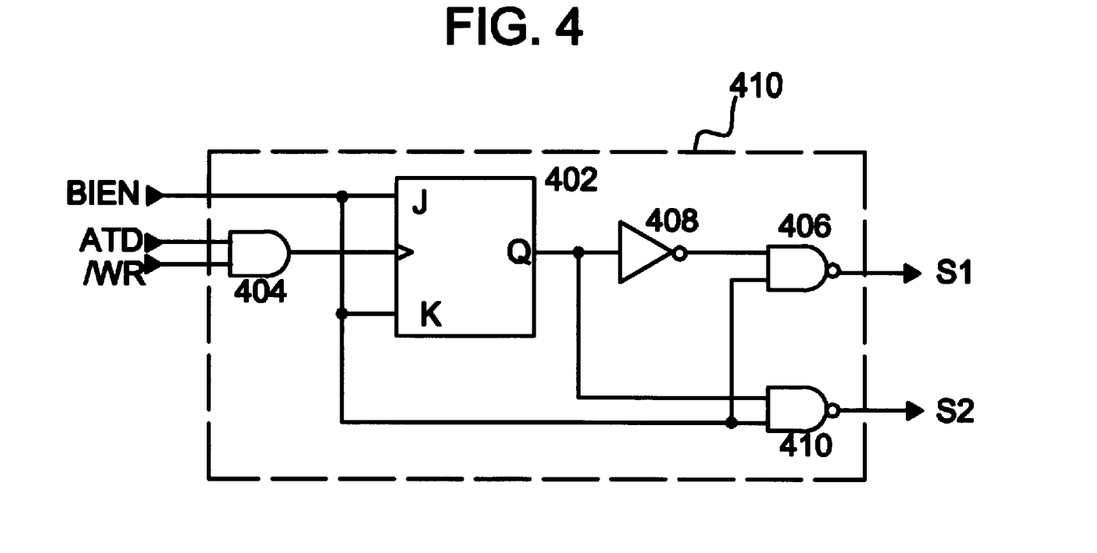
FIG. 4 is a circuit diagram showing an exemplary drive controller of the data output buffer of FIG. 3.

FIG. 4 is a circuit diagram showing an exemplary drive control section in the first preferred embodiment of a data output buffer according to the present invention. The burn-in enable signal BIEN is input to a J-K flip-flop 402. The address transition detection signal ATD and the write bar signal /WR are fed into an AND gate 404. The output of the AND gate 404 is used as the clock of the J-K flip-flop 402. The output Q of the J-K flip inverted by an inverter circuit 408 and the burn-in enable signal BIEN are input to the NAND gate 406. The output Q of the J-K flip-flop 402 and the burn-in enable signal BIEN are fed into another NAND gate 410. The outputs of the two NAND gates 406 and 410 are first and second drive control signals S1 and S2, respectively.

Two inputs of the J-K flip-flop 402, that is, J and K are both burn-in enable signals BIENs. If the burn-in enable signal BIEN is set to 0, the logic value of the output Q does not change even when the clock (e.g., the AND gate 404) is input to the J-K flip-flop 402. If the clock occurs with the burn-in enable signal BIEN being 1, the logic value of the output Q changes.

The output Q of the J-K flip-flop 402 is inverted and then input to the NAND gate 406, but the output Q is directly input to the other NAND gate 410 without inversion. Thus, the first and second drive control signals S1 and S2 are opposite to each other in their logic values when second inputs of the NAND gates 406 and 410, (i.e., burn-in enable signals BIENs) are 1. In addition, if the clock is input continuously with the burn in enable signal BIEN being 1, the output Q of the J-K flip-flop 402 is inverted in each time (e.g., cycle) of the clock such that the logic values of the first and second control signals S1 and S2 are also inverted alternately for each cycle of the clock.

If the burn-in enable signal BIEN is 0, however, the first and second drive control signals S1 and S2 are held at a high logic level. The burn-in signal BIEN is preferably 0 in the normal operation mode. Accordingly, in the normal operation mode, the first and second drive control signals S1 and S2 are both held at a high logic level, which causes both of the first and second output driving sections 312 and 314 in the data output buffer to be activated.

Figure 5:
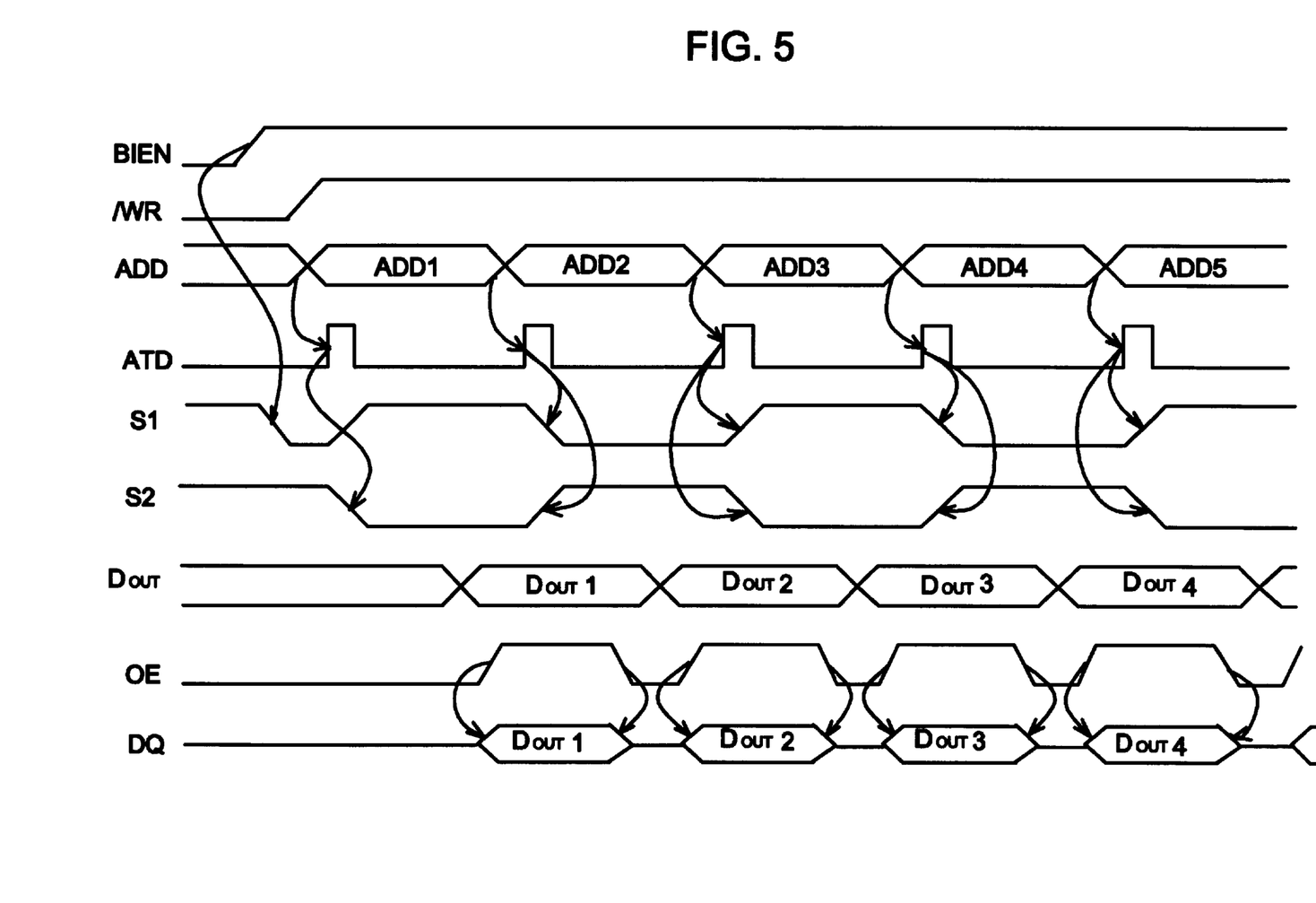
FIG. 5 is a timing diagram illustrating operational characteristics of the data output buffer of FIG. 3.

FIG. 5 is a timing diagram illustrating operational characteristics of the first preferred embodiment of a data output buffer according to the present invention. In the normal operation mode, the burn-in enable signal BIEN is 0 and the first and second drive control signal S1 and S2 are both 1. Thus, the first and second output driving sections 312 and 314 are both activated in the data output buffer. A pull-up operation or pull-down operation is performed in both of the two output driving sections 312 and 314 when the unit data signal $D_{OUT}$ is transferred to the data output pad.

The amount of current flowing across the data output pad results from the current driving capacity of the first preferred embodiment of the data output buffer shown in FIG. 3. The supply voltage $V_{DD}$ is at a regulated voltage level because of the normal operation mode in this case. Therefore, the amount of current flowing the data output pad does not exceed the regulated level.

The burn-in test mode starts up when the burn-in enable signal BIEN is shifted to 1. A single pulse is generated in the address transition detection signal ATD every time the address ADD is input to read a data while the write bar /WR is 1.

As described above, the result of an AND operation of the detection signal ATD is used as a clock of the J-K flip-flop 402. Consequently, if the write bar signal /WR is held at a high logic level, the address transition detection signal ATD immediately becomes the clock of the J-K flip-flop 402. Thus, the first and second drive control signals S1 and S2 have their logic values inverted in every one of the cycles of the address transition detection signal ATD. The phase or logic value of the first drive control signal S1 is opposite to that of the second drive control signal S2.

A first signal pulse occurs at the address detection signal ATD simultaneously when a first address signal ADD1 is input. The first single pulse in the ATD signal causes the first drive control signal S1 to be 1 and the second drive control signal S2 to be 0. If a first data signal $D_{OUT1}$ is input and the output enable signal OE is activated to be 1 while the first drive control signal S1 is set to 1, the first data signal $D_{OUT1}$ is transferred to the data output pad 334 as an output data signal DQ.

In the first preferred embodiment of the data output buffer shown in FIG. 3, at this time, the first output driving section 312 is activated but the second output driving section 314 is not. Thus, pull-up or pull-down operations of the output data signal DQ is achieved only at the first output driving section 312.

When a second address signal ADD2 is input, a second single pulse occurs at the address transition detection signal ATD. The second single pulse in the ATD signal causes the first drive control signal S1 to be 0 and the second drive control signal S2 to be 1. If a second data signal $D_{OUT2}$ is input and the output enable signal OE is activated to be 1 again while the second drive control signal S2 is set to 1, the second data signal $D_{OUT2}$ is transferred to the data output pad 334 as the output data signal DQ.

In the data output buffer shown in FIG. 3, at this time, the second output driving section 314 is activated but the first output driving section 312 is not. Thus, pull-up or pull-down operations of the output data signal DQ is achieved only at the second output driving section 314.

Thus, data signals $D_{OUT1}$, $D_{OUT3}$, . . . input in the time bearing odd numbers are preferably output when the first drive control signal S1 is activated to be 1. Further, the data signals $D_{OUT2}$, $D_{OUT4}$, . . . input in the time bearing even numbers are output when the second drive control signal S2 is activated to 1.

As described above, the two divided output driving sections 312 and 314 are alternately activated every time a new data signal $D_{OUT}$ is input. When a unit data signal $D_{OUT}$ is transferred to the data output pad 334, the amount of current flowing across the data output pad 334 reduced to ½ because of pull-up or pull-down operations of one of the two output driving sections 312 and 314 compared with the amount of current flowing across the data output pad 334 in the normal operation mode. Accordingly, an excessive current does not flow across the data output pad in the burn-in test mode even through a supply voltage much higher than the regulated supply voltage $V_{DD}$ is supplied.

Figure 6:
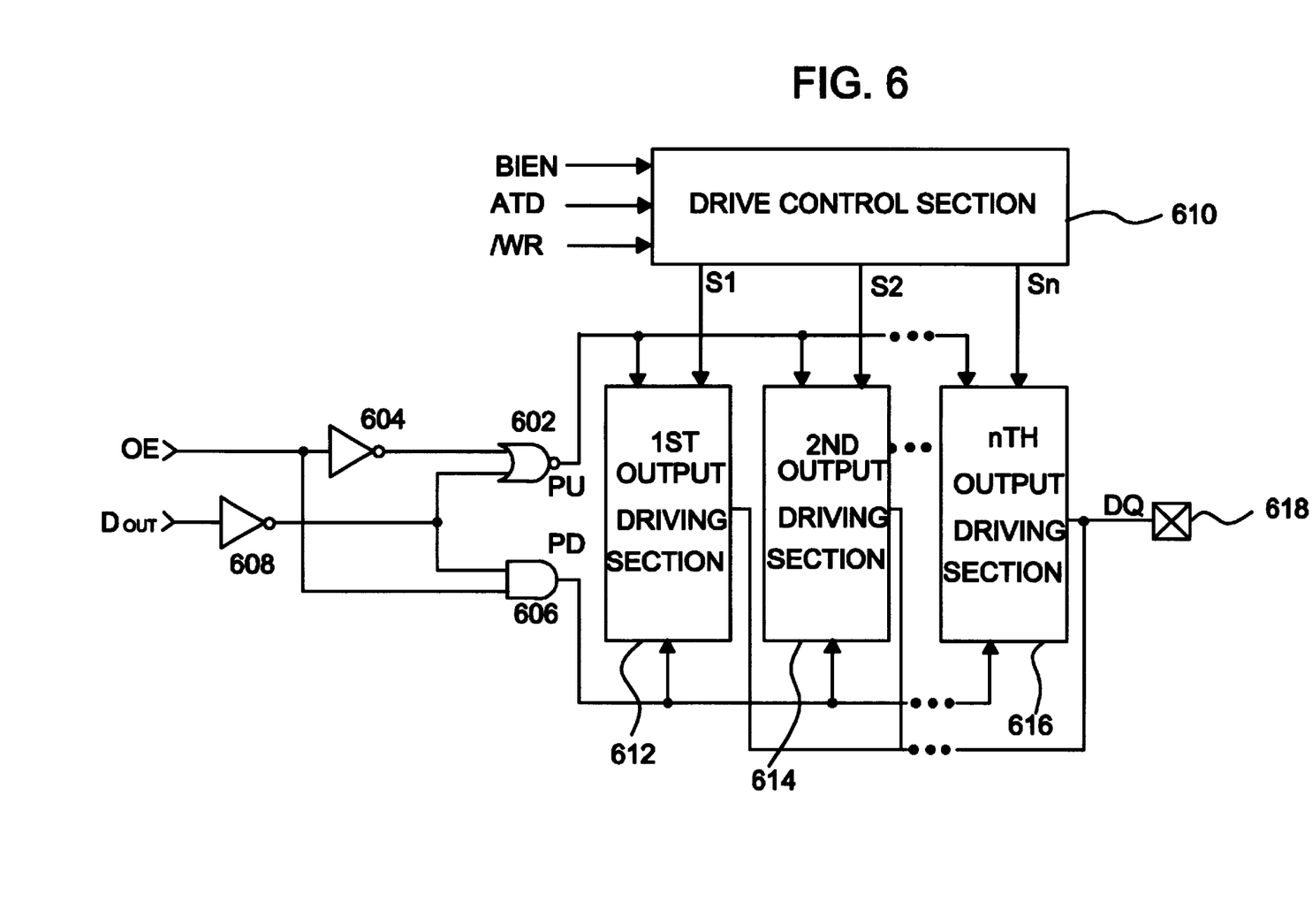
FIG. 6 is a block diagram showing another preferred embodiment of a data output buffer according to the present invention.

FIG. 6 is a block diagram showing a second preferred embodiment of a data output buffer according to the present invention. The second preferred embodiment of the data output buffer according to the present invention has "n" output driving sections or stages 612–616 and a drive control section 610.

The procedures in which the output enable signal OE and the data signal $D_{OUT}$ are input to generate a pull-up signal PU and a pull-down signal PD in the second preferred embodiment of the data output buffer are similar to the procedures in the first preferred embodiment of FIG. 3. Thus, a detailed description is omitted. The pull-up signal PU output from a NOR gate 602 and the pull-down signal PD from an AND gate 606 are input to the n output driving sections 612–616.

The burn-in enable signal BIEN, the address transition detection signal ATD and the write bar signal /WR are input to the drive control section 610. The drive control section uses the input signals BIEN, ATD and /WR to preferably sequentially activate n drive control signals S1–Sn. The n drive control signals S1–Sn output from the drive control section 610 are input to the n output driving sections 612–616, respectively.

The internal construction and operation of the respective output driving sections 612–616 shown in FIG. 6 are analogous to those of the output driving sections 312 and 314 shown in FIG. 3. Accordingly, a detailed description is omitted. Each output of the output driving sections 612–616 is transferred to a data output pad 618.

Figure 7:
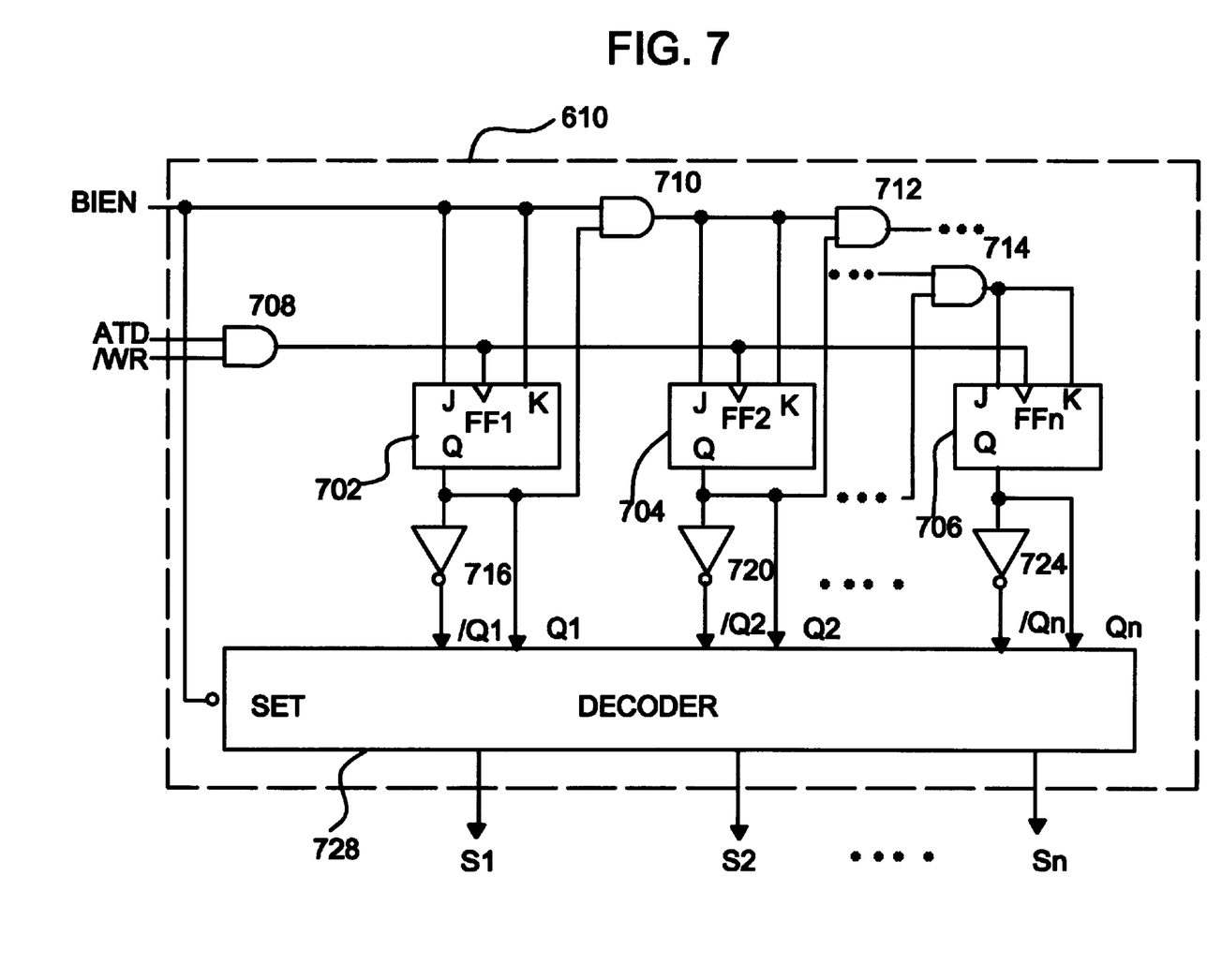
FIG. 7 is a circuit diagram showing an exemplary drive controller of the data output buffer of FIG. 6.

FIG. 7 is a circuit diagram showing an exemplary drive control section 610 for use in the second preferred embodiment of the data output buffer according to the present invention. All J-K flip-flops 702–706 of the drive control section 610 shown in FIG. 7 use the result of an AND operation by an AND gate 708 between the address transition detection signal ATD and the write bar signal /WR as a clock.

The burn-in enable signal BIEN is input to the first J-K flip-flop 702. Outputs Q1(/Q1) of the first J-K flip-flop 702 are input to a decoder 728. The signal /Q1 is provided as an output of an inverter circuit 716, which is coupled to receive the output Q of the first J-K flip-flop 702. The result of an AND operation between the burn-in enable signal BIEN and the output Q1 of the first J-K flip-flop 702 is provided as an output of AND-gate 710 and input to a second J-K flip-flop 704. Outputs Q2(/Q2) of the second J-K flip-flop 704 are also input to the decoder 728. An input of a third J-K flip-flop (not shown) is a result of an AND operation between the output of an AND gate 712 and the output Q2 of the (i.e., previous) second J-K flip-flop 704. The result of an AND operation between the input and output of a penultimate J-K flip-flop (not shown) of the drive control section 610 is input to the last nth J-K flip-flop 706 by an AND gate 714. The output Qn(/Qn) of the nth J-K flip-flop 706 is also input to the decoder 728.

Two inputs J and K of the first J-K flip-flop 702 are both burn-in enable signals BIENs. If the burn-in enable signal BEN is set to 0, there is no change in the logic value of the output Q even when the clock is input to the first J-K flip-flop 702. Contrarily, if the clock input occurs with the burn-in enable signal BIEN being 1, the logic value of the output Q changes.

Operational characteristics of the remaining J-K flip-flops 704 through 706 are analogous to the first J-K flip-flop 702. The output of each J-K flip-flop except for the first J-K flip-flop 702 is determined by the output of their previous J-K flip-flip when the burn in enable signal BIEN is set to 1.

If the clock, which is preferably the output of the AND gate 708, is input to each of the J-K flip-flops with the output Q of the first J-K flip-flop 702 being 1 and the output Q of the second J-K flip-flop 704 being 0, then the output Q of the first J-K flip-flop 702 is inverted to 0 and the output Q of the second J-K flip-flop 704 is inverted to 1. That is, the output Q (e.g., Qx-1)of the previous J-K flip-flop affects the input and the output Q (e.g., Qx) of the next J-K flip-flop. Thus, the logic values of the drive control signals S1–Sn output from the respective J-K flip-flop preferably propagate in sequence from the first drive control signal S1 to the nth drive control signal Sn.

The decoder 728 is enabled by the burn-in enable signal BIEN and decodes the outputs of the J-K flip-flops 702–706. The outputs S1–Sn of the decoder 728 are drive control signals for the n output driving sections 612–616. The drive control signals S1–Sn preferably sequentially drive the n output driving sections 612–616 shown in FIG. 6. The decoder 728 preferably has all outputs S1–Sn at a high logic level when the burn-in enable signal BIEN is 0 (i.e., at a low logic level). As a result, all of the output driving sections 612–616 shown in FIG. 6 are activated in the normal operation mode, while only selected or a part of the output driving sections, which receive a drive control signal having a high logic level, can be activated in the burn-in test mode.

Figure 8:
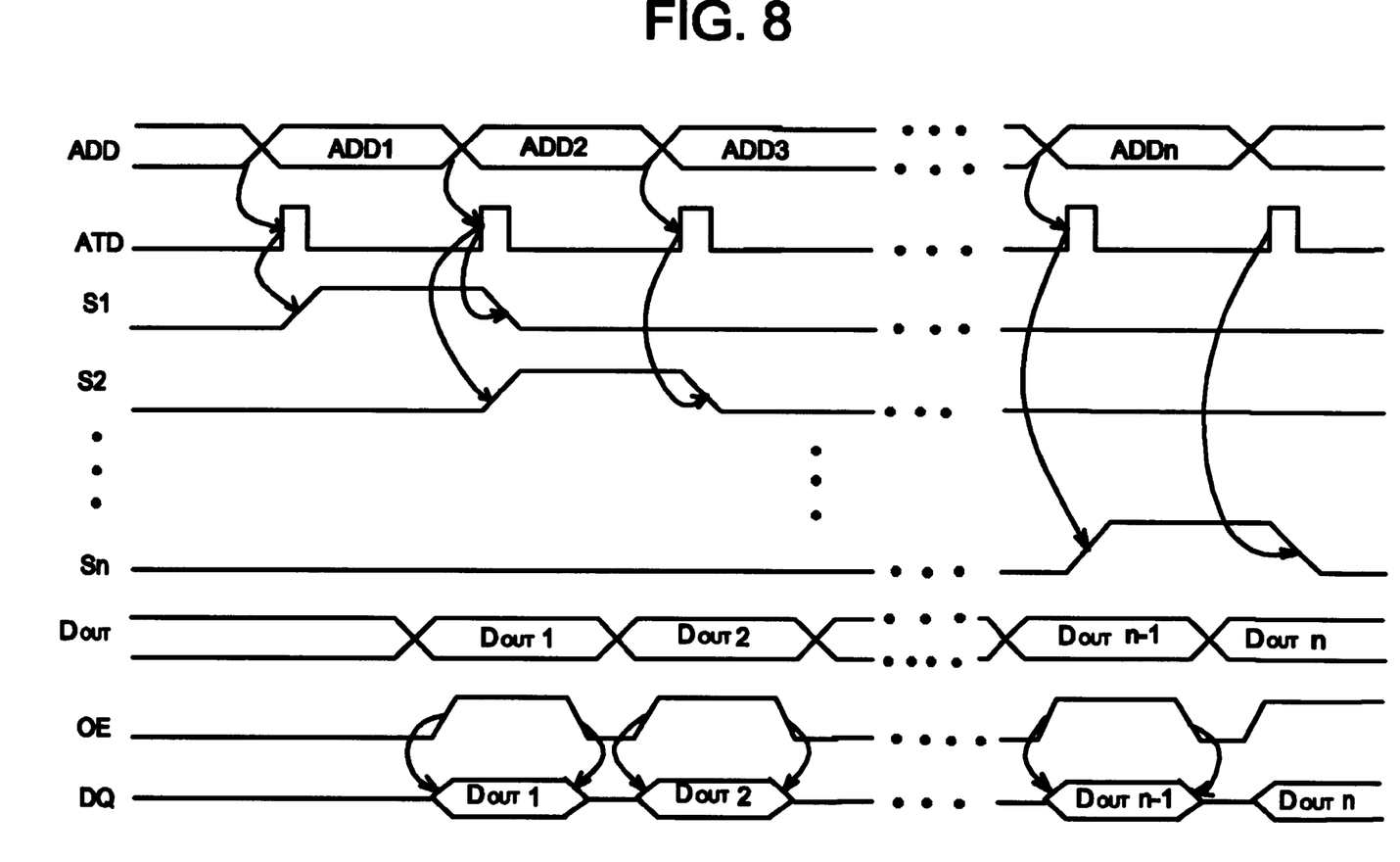
FIG. 8 is a timing diagram illustrating operational characteristics of the data output buffer of FIG. 6.

FIG. 8 is a timing diagram illustrating operational characteristics of the second preferred embodiment of a data output buffer according to the present invention in the burn-in test mode. When an address ADD to read a data is input in the burn-in test mode, a single pulse occurs in an address transition detection signal ATD each time a new address is input.

As described above in connection with FIG. 7, the result of an AND operation between write bar signal /WR and address transition detection signal ATD is used as the clock of each of the J-K flip-flops 702–706. If the write bar signal /WR is held at a high logic level, the address transition detection signal ATD acts as a clock of the J-K flip-flops 702–706. Accordingly, one of the n drive control signals S1–Sn is preferably set to 1 sequentially in every cycle of the address transition detection signal ATD. However, the present invention is not intended to be so limited. For example, a subset of the output driving sections 612–616 could be enabled, or the drive control signals could be randomly set to 1.

A first signal pulse occurs at the address detection signal ATD at the moment that a first address signal ADD 1 is input. The first single pulse causes the first drive control signal S1 to be 1 and the rest of the drive control signals S2–Sn to be 0. If a first data signal $D_{OUT1}$ is input and the output enable signal OE is activated to be 1 while the first drive control signal S1 is set to 1, the first data signal $D_{OUT1}$ is transferred to the data output pad 618 as an output data signal DQ. At this time, the first output driving section 612 is activated by the first drive control signal set to 1 but the rest of the output driving sections 614–616 are not. Thus, pull-up or pull-down operation of the output data signal DQ is achieved by the first output driving section 612 only.

When a second address signal ADD2 is input, a second single pulse occurs at the address transition detection signal ATD. The second single pulse causes the second drive control signal S2 to be 1. The rest of the drive control signals S1 and S3 . . . Sn exclusive of the second drive control signal S2 are 0. If a second data signal $D_{OUT2}$ is input and the output enable signal OE is activated to be 1 again while the second drive control signal S2 is set to 1, the second data signal $D_{OUT2}$ is transferred to the data output pad 618 as the output data signal DQ. In this case, only the second output driving section 614 is activated but the remaining output driving sections including 612 and 616 are not. Thus, pull-up or pull-down operation of the output data signal DQ is achieved at the second output driving section 614 only.

The respective output driving sections 612 through 616 are preferably sequentially activated for n cycles of the address transition detection signal ATD to output n data signals $D_{OUT}$ in the burn-in test mode. To output one data signal $D_{OUT}$, a pull-up or pull-down operation is performed by only one output driving section of the data output buffer during each cycle of the address transition detection signal ATD.

When a unit data signal $D_{OUT}$ is transferred to the data output pad 618 according to the second preferred embodiment of the data output buffer, the amount of current flowing across the data output pad 618 in the burn-in test mode is preferably reduced to 1/n of the amount of current in the normal operation mode. Accordingly, excessive current is prevented from flowing or reduced across the data output pad in the burn-in test mode even through a supply voltage much higher than the regulated supply voltage $V_{DD}$ is supplied to the data output pad.

The read cycle of the burn-in test mode is longer by ten times or more than the normal operation mode. If the read cycle of the burn-in test mode is over 1 μs, for example, that of the normal operation cycle is less than 0.1 μs. It is thus possible to supply currents sufficient to perform a burn-in test to the data output pad even though the current driving capacity of the data output buffer of the present invention is reduced in the burn-in test mode.

As described above, the preferred embodiments of a data output buffer according to the present invention have various advantages. The preferred embodiments of data output buffer avoid an excessive current formed across the data output pad in the burn-in test mode and enable a stable burn-in test.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A data output buffer comprising:
    an input circuit that receives a data signal and an output enable signal, wherein when the output enable signal is a prescribed value, first and second signals having logic values based on the data signal are output by the input circuit;
    a drive control circuit that receives a burn-in enable signal and a clock signal and activates a subset of a plurality of drive control signals; and
    a plurality of output driving circuits, each receiving the first and second signals and a corresponding one of the drive control signals, wherein the subset of drive control signals activate a data output operation in the corresponding ones of the plurality of drive control circuits depending on the logic value of the data signal.

2. The data output buffer of claim 1, wherein each of the plurality of output driving circuits are coupled to an output line, wherein the plurality of output driving circuits are N in number, and wherein the drive control signals sequentially activate one of the output driving circuits to reduce a burn-in mode current generated by the output line by 1/N.

3. The data output buffer of claim 1, wherein the drive control circuit comprises:

a counter; and a decoder that decodes an output of the counter.

4. The data output buffer of claim 1, wherein the drive control circuit comprises:

an n-bit counter that receives the clock signal based on an address shift detection signal and a write signal, wherein the n-bit counter uses the burn-in enable signal as a count enable signal; and a decoder that decodes an output of the n-bit counter to generate the plurality of drive control signals.

5. The data output buffer as claimed in claim 1, wherein the drive control circuit comprises:

a logic-gate that logically processes an address shift detection signal and a write bar signal to generate the clock signal;

a plurality of flip-flops coupled in series each receiving the clock signal, wherein a first flip flop generates one of a plurality of intermediate signals responsive to the burn-in enable signal, and wherein remaining ones of the plurality of flip flops generate remaining ones of the plurality of intermediate signals responsive to a logic operation on an input signal and an output signal of a preceding flip flop of the plurality of flip flops; and a decoder that decodes the intermediate signals to generate the drive control signals.

6. The data output buffer of claim 1, wherein the data output buffer operates in a normal operation mode and a burn-in operation mode, wherein a sum of the current driving capacities of the output driving circuits is not less than a current driving capacity to be supplied in the normal operation mode.

7. The data output buffer of claim 1, wherein the output driving circuits each have an approximately equal current driving capacity.

8. The data output buffer of claim 1, wherein each of the output driving circuits comprises:

a first logic-gate being that receives the first drive control signal and the pull-up signal;

a second logic-gate that receives the first drive control signal and the pull-down signal;

a first pull-up device that pulls up an output line responsive to an output of the first logic gate; and a second pull-down device that pulls down the output line responsive to an output of the second logic gate.

9. The data output buffer of claim 8, further comprising a data output pad coupled to the output line, wherein the first and second signals are pull-up and pull-down signals, wherein the clock signal is based on an inverted write signal logically combined with an address transition detection signal, wherein the first logic gate is a NAND gate and the second logic gate is an AND gate, and wherein the first pull-up device and the second pull-down device are transistors.

10. A data output buffer comprising:

input means for receiving a data signal and an output enable signal, wherein when the output enable signal is a prescribed value, a pull-up signal having the same logic value as the data signal and a pull-down signal having an inverted logic value of the data signal are output by the input section;

drive control means for receiving that receives a first signal and a second signal and for alternately activating first and second drive control signals;

first output driving means for receiving the pull-up signal and the pull-down signal and is enabled by the first drive control signal for performing a pull-up or pull-down operation depending on the logic value of the data signal; and second output driving means for receiving the pull-up signal and the pull-down signal and is enabled by the second drive control signal for performing the pull-up or pull-down operations depending on the logic value of the data signal.

11. The data output buffer of claim 10, wherein the drive control means comprises:

first logic means for logically combining the second signal and a third signal;

a flip-flop responsive to the first signal that uses an output signal of the first logic means as a clock signal;

second logic means for logically combining an inverted output of the flip-flop and the first signal that outputs the first drive control signal; and third logic means for logically combining an output of the flip-flop and the first signal that outputs the second drive control signal.

12. The data output buffer of claim 10, wherein the data output buffer operates in first and second modes, wherein a sum of the current driving capacities of the first and second output driving means is not less than the current driving capacity to be supplied in the first operation mode.

13. The data output buffer of claim 10, wherein the first and second output driving means have approximately the same current driving capacity.

14. The data output buffer of claim 10, wherein the first output driving means comprises:

first pull-up means for pulling up when the first drive control signal and the pull-up signal are a high level; and first pull-down means for pulling down when the first drive control signal and the pull-down signal are high level.

15. The data output buffer of claim 10, wherein the first output drive means comprises:

first logic means for logically combining the first drive control signal and the pull-up signal;

second logic means for logically combining the first drive control signal and the pull-down signal;

first pull-up means for pulling up an output line responsive to an output of the first logic means; and first pull-down means for pulling down the output line responsive to an output of the second logic means.

16. The data output buffer of claim 15, wherein the second output drive means comprises:

third logic means for logically combining the first drive control signal and the pull-up signal;

fourth logic means for logically combining the first drive control signal and the pull-down signal;

second pull-up means for pulling up the output line responsive to an output of the third logic gate; and second pull-down means for pulling down the output line responsive to an output of the fourth logic gate.

17. The data output buffer of claim 16, further comprising data output means for outputting data coupled to the output line, wherein the first, second and third signals are a burn-in enable signal, an address shift detection signal and an inverted write signal, respectively, and wherein the first and third logic means are NAND gates and the second and fourth logic means are AND gates.

18. A data output buffer comprising:

an input section that receives a data signal and a control signal, wherein when the control signal is a prescribed value, first and second signals having logic values based on the data signal are output by the input section; and an output section including a plurality of output driving sections coupled to an output line, each receiving the first and second signals and a corresponding one of a plurality of second control signals, wherein the data output buffer operates in a normal mode and a burn-in mode, wherein the burn-in mode of the data output buffer selectively activates a subset of the plurality of drive control sections according to the second control signals so that a current driving capacity of the output line in the burn-in mode is reduced.

19. The data output buffer of claim 18, further comprising a drive control section that receives a burn-in enable signal and a clock signal to generate the second control signals, wherein the drive control section sequentially activates only one of the second control signals in the burn-in mode, and wherein each of the plurality of output driving sections are activated by the second control signals in the normal mode.

* * * * *